(12) United States Patent
Ochi et al.

(10) Patent No.: US 11,892,248 B2
(45) Date of Patent: Feb. 6, 2024

(54) COOLING UNIT AND METHOD FOR MANUFACTURING COOLING UNIT

(71) Applicant: Panasonic Intellectual Property Management Co., Ltd., Osaka (JP)

(72) Inventors: Shozo Ochi, Osaka (JP); Masato Maede, Kyoto (JP); Tomonari Nebashi, Kanagawa (JP); Ryo Ishikawa, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/664,664

(22) Filed: May 24, 2022

(65) Prior Publication Data
US 2022/0397353 A1    Dec. 15, 2022

(30) Foreign Application Priority Data
Jun. 10, 2021  (JP) .................................. 2021-097588

(51) Int. Cl.
| | | |
|---|---|---|
| F28F 21/08 | (2006.01) | |
| B23K 20/12 | (2006.01) | |
| H05K 7/20 | (2006.01) | |
| B23K 103/10 | (2006.01) | |

(52) U.S. Cl.
CPC .......... *F28F 21/084* (2013.01); *B23K 20/122* (2013.01); *H05K 7/20927* (2013.01); *B23K 2103/10* (2018.08)

(58) Field of Classification Search
CPC . B23K 20/122; B23K 2103/10; F28F 21/084; F28F 2275/062; H05K 7/20927
See application file for complete search history.

(56) References Cited

U.S. PATENT DOCUMENTS

| | | | |
|---|---|---|---|
| 10,471,557 B2 * | 11/2019 | Hori .................... | B23P 15/26 |
| 2013/0062750 A1 | 3/2013 | Lenniger et al. | |
| 2016/0325374 A1 | 11/2016 | Hori et al. | |
| 2018/0141152 A1 | 5/2018 | Hori et al. | |
| 2018/0264584 A1 | 9/2018 | Hori et al. | |
| 2019/0358740 A1 * | 11/2019 | Hori .................... | B23K 20/122 |
| 2021/0370433 A1 | 12/2021 | Hori et al. | |

FOREIGN PATENT DOCUMENTS

| | | |
|---|---|---|
| EP | 3854512 | 7/2021 |
| JP | 2001-071156 | 3/2001 |
| JP | 2010-023068 | 2/2010 |
| JP | 5572678 B | 8/2014 |

(Continued)

OTHER PUBLICATIONS

Office Action dated Oct. 21, 2022 in related European Patent Application No. 22174543.3.

*Primary Examiner* — Jason L Vaughan
*Assistant Examiner* — Amanda Kreiling
(74) *Attorney, Agent, or Firm* — Wenderoth, Lind & Ponack, L.L.P.

(57) ABSTRACT

A cooling unit includes a unit main body including a bottom portion, a peripheral wall portion rising from the peripheral edge of the bottom portion, and a seal for sealing an opening of the unit main body. The unit main body is joined to the seal through a plasticized region, and a void is defined in the peripheral wall portion of the unit main body.

5 Claims, 5 Drawing Sheets

(56) References Cited

FOREIGN PATENT DOCUMENTS

| | | |
|---|---|---|
| JP | 2015-131321 | 7/2015 |
| JP | 2019-000886 | 1/2019 |
| JP | 2019-76949 | 5/2019 |
| JP | 2020-022973 | 2/2020 |
| JP | 2021-087962 | 6/2021 |
| WO | 2018/003449 | 1/2018 |
| WO | 2020/059198 | 3/2020 |
| WO | 2020/095483 | 5/2020 |

* cited by examiner

COOLING UNIT AND METHOD FOR MANUFACTURING COOLING UNIT

BACKGROUND

1. Technical Field

The present invention relates to a cooling unit to be used for cooling vehicle-mounted equipment and other electronic equipment, and a method for manufacturing the cooling unit.

2. Description of the Related Art

In recent years, as a semiconductor device for power conversion used for inverter control of a vehicle-mounted battery charger, electronic equipment typified by air-conditioners, air-conditioning equipment, personal computers, and the like, have been improved in performance, heating values of electronic components (a heat generating body) to be installed have been increased. It has been important to cool such electronic components.

In electric vehicles and plug-in hybrid vehicles, a vehicle-mounted battery charger for charging a battery as a storage battery is installed. Usually, a vehicle-mounted battery charger is provided with a cooling unit to prevent components from being burned out due to a temperature rise during battery charging (see, for example, PTLs 1 and 2). In particular, PTL 2 discloses a technique for joining a jacket main body as a metallic constituent member and a sealing body by friction stir welding, as a manufacturing method for maintaining water-tightness and air-tightness of a liquid-cooling type cooling unit.

Friction Stir Welding (FSW) is a method for solid-phase welding metal members to each other by moving a rotary tool along a butted portion of metal members while rotating the rotary tool, and by allowing the metal in the butted portion to plastically flow by frictional heat between the rotary tool and the metal members.

CITATION LIST

Patent Literature

PTL 1: Japanese Patent No. 5572678
PTL 2: Japanese Patent Application Unexamined Publication No. 2015-131321

SUMMARY

A cooling unit according to one aspect of the present disclosure includes:
- a unit main body having a bottom portion and a peripheral wall portion rising from a peripheral edge of the bottom portion; and
- a sealing body for sealing an opening of the unit main body,
- wherein the unit main body is joined to the sealing body through a plasticized region, and a void is formed at a position close to the unit main body with respect to a center of the plasticized region.

A method for manufacturing a cooling unit according to one aspect of the present disclosure includes:
- a first step of processing a unit main body having a bottom portion and a peripheral wall portion rising from a peripheral edge of the bottom portion to form a stepped portion in an inner peripheral edge of the peripheral wall portion, the stepped portion including a stepped bottom surface and a stepped side surface rising from the stepped bottom surface toward an opening of the unit main body;
- a second step of placing a sealing body for sealing the opening of the unit main body on the stepped bottom surface in a state in which a side surface of the sealing body and the stepped side surface butt each other to form a butted portion having a gap between the side surface of the sealing body and the stepped side surface; and
- a third step of pushing a rotary tool into the butted portion, moving the rotary tool along the butted portion while the rotary tool being rotated.

DETAILED DESCRIPTION OF PREFERRED EMBODIMENTS

In a liquid-cooling jacket disclosed in PTL 2, a jacket main body has a complicated shape, and, therefore is formed of, for example, an aluminum alloy casting material. On the other hand, a product having a relatively simple shape, for example, a sealing body is formed of an aluminum alloy expanded material.

In the case of manufacturing a liquid-cooling jacket by joining members of different types of aluminum alloys, it is common that the rigidity of the jacket main body is higher than that of the sealing body. In this case, when both members are joined by friction stir welding, a stirring pin as a rotating tool receives higher material resistance from the jacket main body than from the sealing body.

Consequently, if the size variation of the jacket main body and the sealing body increases due to, for example, the increase in size of the liquid-cooling jacket, and shape variation occurs, for example, a gap occurs in a butted portion, it becomes difficult to stir different materials in balance by the stirring pin, and a void may be generated in a plasticized region after joining. Herein, the plasticized region is a region in which stirring is carried out by pushing a rotary tool into the butted portion, and a region in which plastically flowing occurs in the peripheral edge by the stirring. In addition, a stress concentration portion is formed in the plasticized region when a water pressure is applied by cooling water flowing in the liquid-cooling jacket. If a void exists in the vicinity of the stress concentration portion, it may cause crack propagation, and the joining strength may be lowered.

An object of the present disclosure is to provide a cooling unit capable of securing the joining strength between a unit main body and a sealing body and having good reliability, and a method for manufacturing the cooling unit.

Hereinafter, exemplary embodiments of a cooling unit in accordance with the present disclosure are described with reference to drawings. Note here that the present disclosure is not limited to the below-mentioned exemplary embodiments.

<Structure of Cooling Unit 1>

Figure 1A:
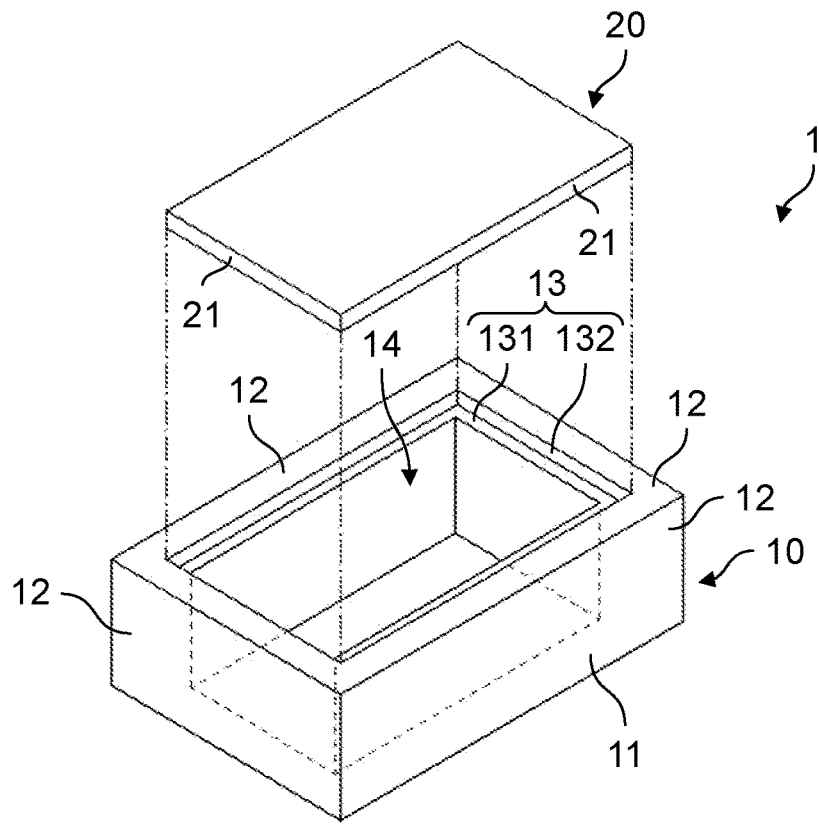
FIG. 1A is a perspective view showing a configuration of a cooling unit in accordance with one exemplary embodiment.
Figure 1B:
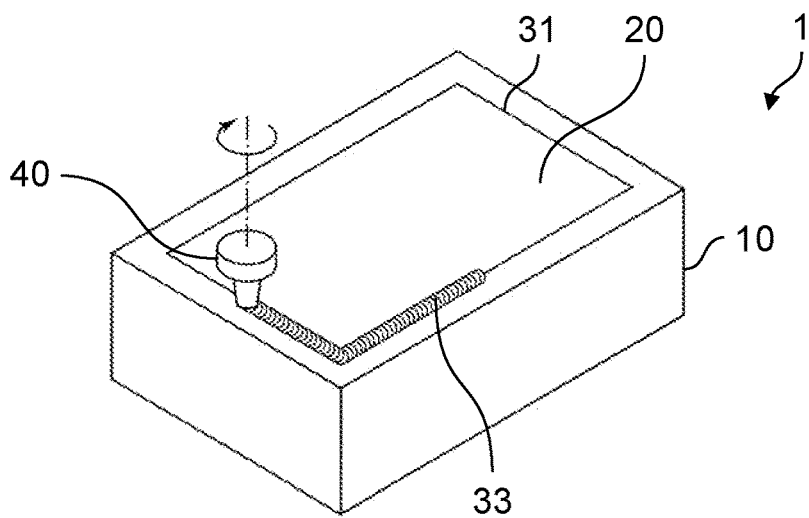
FIG. 1B is a perspective view showing a configuration of the cooling unit in accordance with one exemplary embodiment.
Figure 2:
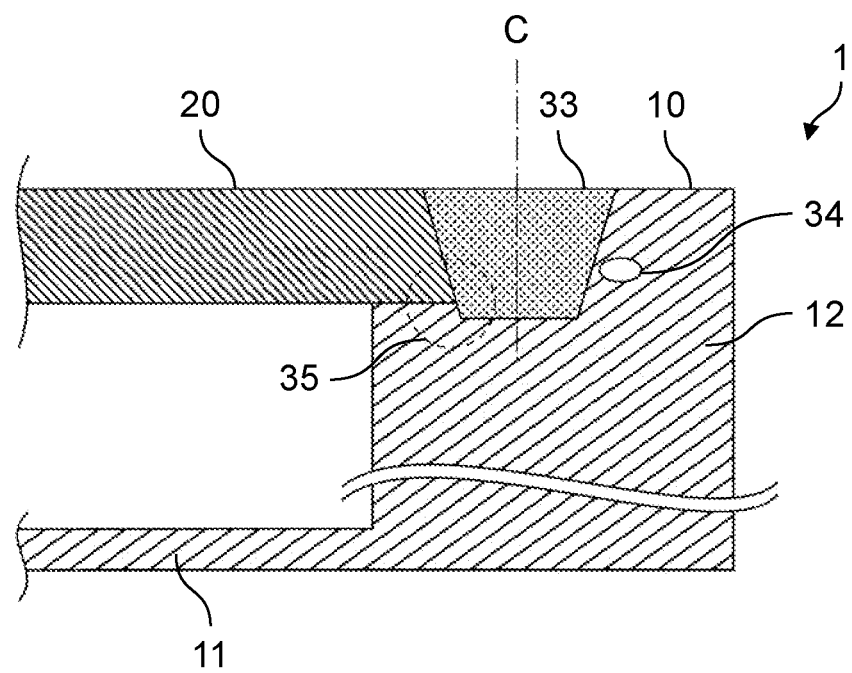
FIG. 2 is a sectional view showing a joined state of the cooling unit in accordance with one exemplary embodiment.

FIGS. 1A and 1B are perspective views each showing a configuration of cooling unit 1 in accordance with one exemplary embodiment. FIG. 1A shows a state of cooling unit 1 before joining in an exploded view, and FIG. 1B shows a state of cooling unit 1 during joining. FIG. 2 is a sectional view showing a joined state of cooling unit 1.

As shown in FIGS. 1A and 1B, cooling unit 1 includes unit main body 10 and sealing body 20. Sealing body 20 is joined to unit main body 10 so as to close opening 14 of unit main body 10, and thus, a sealed space in which cooling water flows is formed. Cooling unit 1 is provided in, for example, a vehicle-mounted battery charger, and prevents components from being burned out due to a temperature rise during battery charging. Although not shown, cooling unit 1 is provided with a circulation channel for allowing a cooling water to circulate in the sealed space.

Unit main body 10 is a box member having bottom portion 11 and peripheral wall portion 12 rising from a peripheral edge of bottom portion 11. Unit main body 10 has, for example, a rectangular box shape in a plan view and having a rectangular opening 14. Furthermore, unit main body 10 includes stepped portion 13 including stepped bottom surface 131 and stepped side surface 132 on the inner peripheral edge at an opening side of peripheral wall portion 12. Stepped side surface 132 is formed so as to rise from stepped bottom surface 131 toward opening 14.

Sealing body 20 is a flat plate member for closing opening 14 and has a size and shape corresponding to opening 14. Sealing body 20 is placed on stepped bottom surface 131 in a state in which side surface 21 of sealing body 20 and stepped side surface 132 butt each other, and joined to unit main body 10 by friction stir welding. Plasticized region 33 is formed in a joined portion between unit main body 10 and sealing body 20. Unit main body 10 is joined to sealing body 20 through plasticized region 33. In the friction stir welding, rotary tool 40 for friction stir welding is used. Rotary tool 40 is formed of, for example, a tool steel, and includes columnar-shaped shoulder portion 41, and stirring pin 42 protruding from the lower end surface of shoulder portion 41 (see, FIG. 3C).

In this exemplary embodiment, void 34, which is generated by friction stir welding, is formed in a unit main body 10 side from the center C of plasticized region 33. Specifically, void 34 is formed inside peripheral wall portion 12 of unit main body 10. That is to say, when cooling water flows and water pressure is applied to cooling unit 1, stress concentration portion 35 is formed in a sealing body 20 side of plasticized region 33. Void 34 is not present in the vicinity of stress concentration portion 35. Therefore, it is possible to prevent cracks from developing from void 34 as a starting point and deteriorating the joining strength. Plasticized region 33 has a length in a first direction along peripheral wall portion 12, and has a width in a second direction perpendicular to the first direction. The center C of plasticized region 33 means the center of the width of plasticized region 33.

Herein, even when void 34 is positioned in a unit main body 10 side from the center C of plasticized region 33, mechanical strength of cooling unit 1 may be deteriorated depending on the size of void 34. Thus, it is desirable that the size of void 34 be 0.3 mm or more and 1.0 mm or less in the direction perpendicular to stepped side surface 132 (direction in parallel to bottom portion 11), or 0.3 mm or more and 1.0 mm or less in the direction perpendicular to stepped bottom surface 131 (direction perpendicular to bottom portion 11). Thus, the mechanical strength of cooling unit 1 can be maintained.

The size of void 34 is controlled by the size of gap 32 formed between sealing body 20 and unit main body 10, as well as rotational speed and movement speed of rotary tool 40. For example, when the rotational speed and the movement speed of rotary tool 40 are constant, the size of void 34 depends on the size of gap 32.

Furthermore, unit main body 10 and sealing body 20 are formed of, for example, an aluminum alloy. This can provide thermal conductivity and mechanical strength required for cooling unit 1, and reduce the weight of cooling unit 1.

In particular, a first aluminum alloy forming unit main body 10 is a material having higher rigidity than a second aluminum alloy forming sealing body 20. Thus, durability of cooling unit 1 can be enhanced.

In addition, it is preferable that unit main body 10 is formed of an aluminum alloy casting material. Thus, castability, strength, machinability, and the like, of unit main body 10 can be enhanced. Furthermore, it is preferable that sealing body 20 is formed of an aluminum alloy expanded material. Thus, workability and thermal conductivity can be enhanced.

<Method for Manufacturing Cooling Unit 1>

The above-described cooling unit 1 is manufactured by, for example, the following steps. FIGS. 3A to 3D show manufacturing steps of cooling unit 1. FIGS. 4A to 4C show the mechanism in which void 34 is formed in cooling unit 1.

Figure 3A:
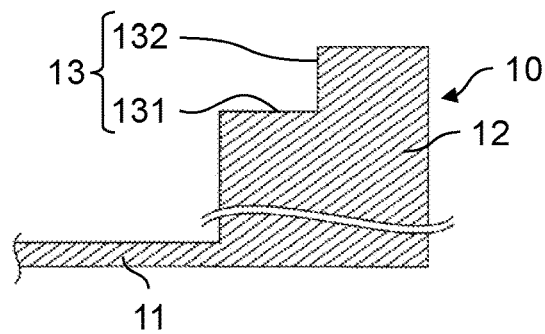
FIG. 3A is a view showing a manufacturing step of the cooling unit in accordance with one exemplary embodiment.
Figure 4A:
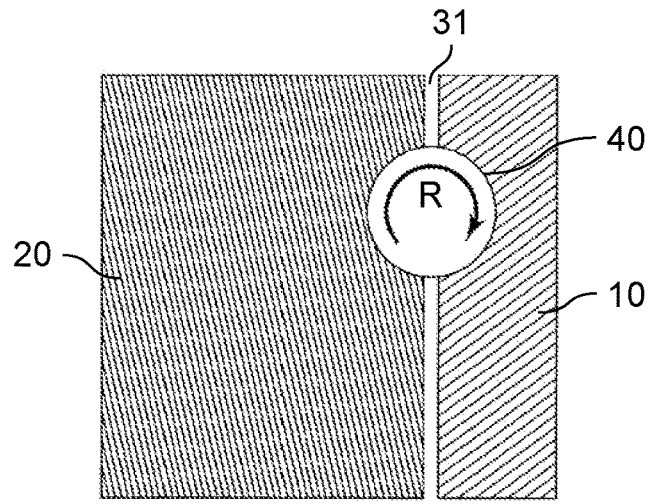
FIG. 4A is a view showing a mechanism in which a void is formed in the cooling unit in accordance with one exemplary embodiment.
Figure 4B:
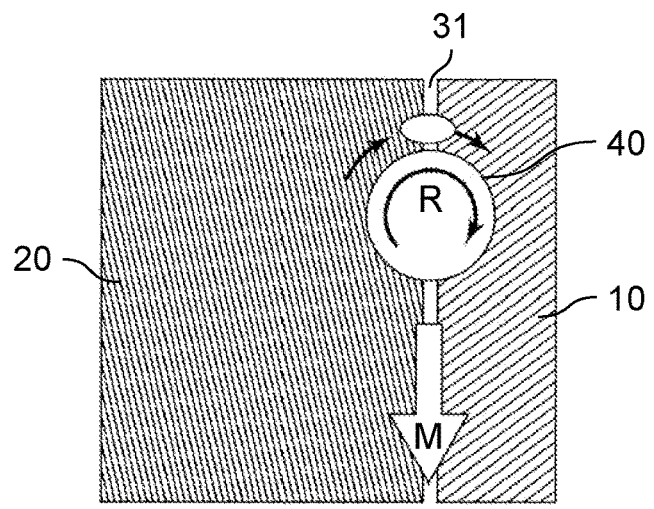
FIG. 4B is a view showing a mechanism in which a void is formed in the cooling unit in accordance with one exemplary embodiment.
Figure 4C:
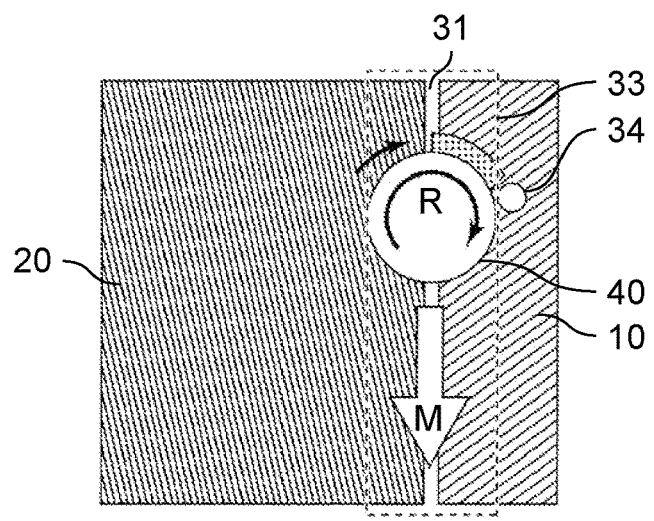
FIG. 4C is a view showing a mechanism in which a void is formed in the cooling unit in accordance with one exemplary embodiment.

Firstly, as a first step, as shown in FIG. 3A, unit main body 10 is processed to form stepped portion 13 at the inner peripheral edge of an opening 14 side of peripheral wall portion 12.

Figure 3B:
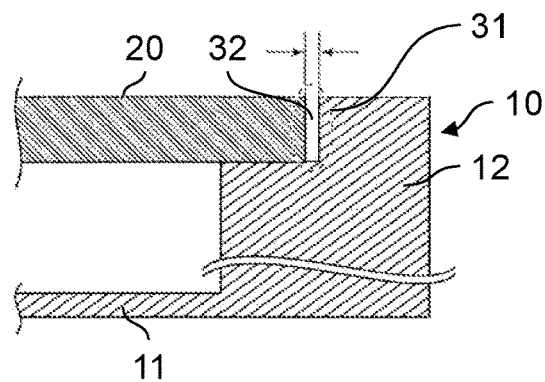
FIG. 3B is a view showing a manufacturing step of the cooling unit in accordance with one exemplary embodiment.

Next, as a second step, as shown in FIG. 3B, sealing body 20 is placed on stepped bottom surface 131 in a state in which side surface 21 of sealing body 20 and stepped side surface 132 butt each other to form butted portion 31 between side surface 21 of sealing body 20 and stepped side surface 132.

At this time, gap 32 is formed between stepped side surface 132 and side surface 21 of sealing body 20 by size variation between unit main body 10 and sealing body 20. A width of gap 32 is 0.1 mm or more and 1.0 mm or less.

Figure 3C:
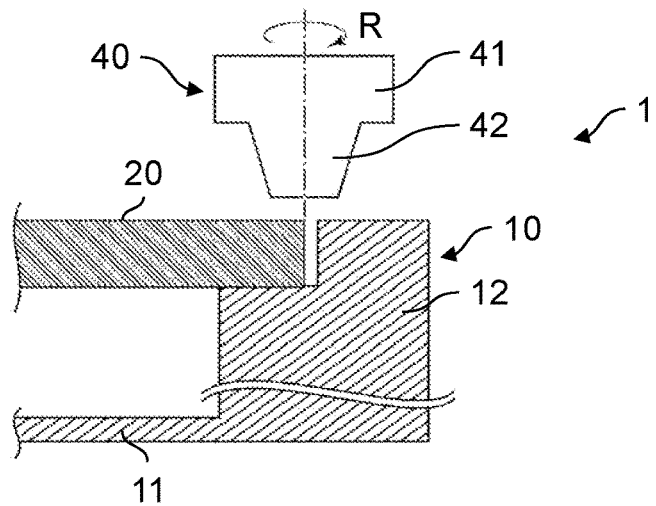
FIG. 3C is a view showing a manufacturing step of the cooling unit in accordance with one exemplary embodiment.
Figure 3D:
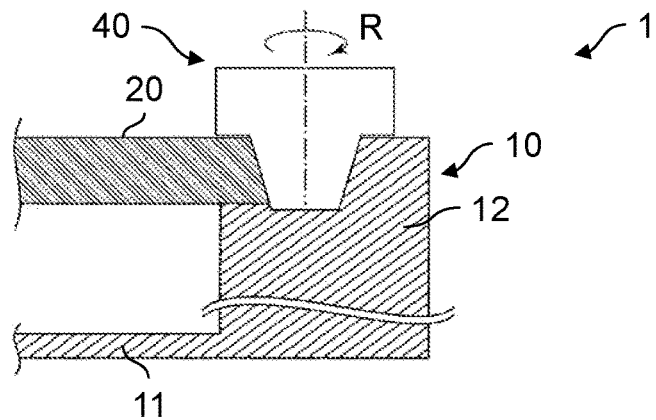
FIG. 3D is a view showing a manufacturing step of the cooling unit in accordance with one exemplary embodiment.

Next, as a third step, as shown in FIGS. 3C and 3D, rotary tool 40 is pushed into butted portion 31, and allowed to move along butted portion 31 while being rotated, and friction stir welding is carried out. Note here that positions of the start point and the end point of the friction stir welding need not be on butted portion 31.

Specifically, as shown in FIG. 4A, a rotating direction R and a travel direction M of rotary tool 40 are set such that a unit main body 10 side is an advancing side (AS) in the rotating direction R of rotary tool 40, and a sealing body 20 side is a retreating side (RS) in the rotating direction R of rotary tool 40. Furthermore, as described below, the rotational speed and the movement speed of rotary tool 40 are set so that void 34 remains in unit main body 10, and is formed outside plasticized region 33.

When rotary tool 40 is allowed to move along butted portion 31, the rear part in the traveling direction M of the rotary tool 40 is filled by sealing body 20 in the retreating side flowing in the rotating direction R. At this time, gap 32 is formed between sealing body 20 and unit main body 10, so that supply of materials become insufficient, and void 34 occurs in the rear part of rotary tool 40.

Void 34 moves toward unit main body 10 as the advancing side by the rotation of rotary tool 40 as shown in FIG. 4C. Since centrifugal force is generated in void 34 as void 34 moves toward unit main body 10, void 34 is gradually apart from rotary tool 40. Then, the movement speed of void 34 becomes slow, and void 34 remains in unit main body 10 of the advancing side, and is formed outside plasticized region 33.

After rotary tool 40 is rotated along butted portion 31 once, and then rotary tool 40 is pulled out. Thus, joining of unit body 10 and sealing body 20 is completed. Voids 34 are successively formed along the travel direction M of rotary tool 40. A plurality of voids 34 may be formed intermittently along the travel direction M of rotary tool 40. In the steps mentioned above, in cooling unit 1, plasticized region 33 is formed along butted portion 31. Furthermore, void 34 is formed at a unit main body 10 side from the center C of plasticized region 33.

In this way, cooling unit 1 in accordance with one exemplary embodiment includes unit main body 10 including bottom portion 11 and peripheral wall portion 12 rising from a peripheral edge of bottom portion 11, and sealing body 20 for sealing opening 14 of unit main body 10. Unit main body 10 has stepped portion 13 including stepped bottom surface 131 and stepped side surface 132 rising from stepped bottom surface 131 toward opening 14 at the inner peripheral edge of peripheral wall portion 12. Sealing body 20 is placed on stepped bottom surface 131 in a state in which side surface 21 of sealing body 20 and stepped side surface 132 butt each other. Furthermore, unit main body 10 is joined to sealing body 20 through plasticized region 33, and void 34 is formed in a unit main body 10 side from the center C of plasticized region 33.

Furthermore, the method for manufacturing cooling unit 1 includes a first step of processing unit main body 10 having bottom portion 11 and peripheral wall portion 12 rising from a peripheral edge of bottom portion 11 to form stepped portion 13 on the inner peripheral edge of peripheral wall portion 12, stepped portion 13 including stepped bottom surface 131 and stepped side surface 132 rising from stepped bottom surface 131 toward opening 14 of unit main body 10 (see FIG. 3A); a second step of placing sealing body 20 for sealing opening 14 of unit main body 10 on stepped bottom surface 131 in a state in which side surface 21 of sealing body 20 and stepped side surface 132 butt each other to form butted portion 31 having a gap between side surface 21 of sealing body 20 and stepped side surface 132 (see FIG. 3B); and a third step of pushing rotary tool 40 into butted portion 31, moving rotary tool 40 along butted portion 31 while rotary tool 40 being rotated (see FIGS. 3C and 3D).

According to cooling unit 1 and the method for manufacturing cooling unit 1, even if the cooling unit has a large size and a complicated structure, the joining strength between unit main body 10 and sealing body 20 can be secured and the reliability can be improved.

More specifically, even if the size variation of unit main body 10 and sealing body 20 increases due to the increase in size of cooling unit 1, and the shape variation occurs, for example, a gap is generated in butted portion 31, since void 34 is disposed in a place apart from stress concentration portion 35, a crack can be prevented from developing from void 34 as a starting point, and joining strength can be secured.

As mentioned above, disclosure by the present inventors is specifically described based on the exemplary embodiments, but the present disclosure is not limited to the above-described exemplary embodiments, and can be modified without departing from the scope thereof.

Figure 5:
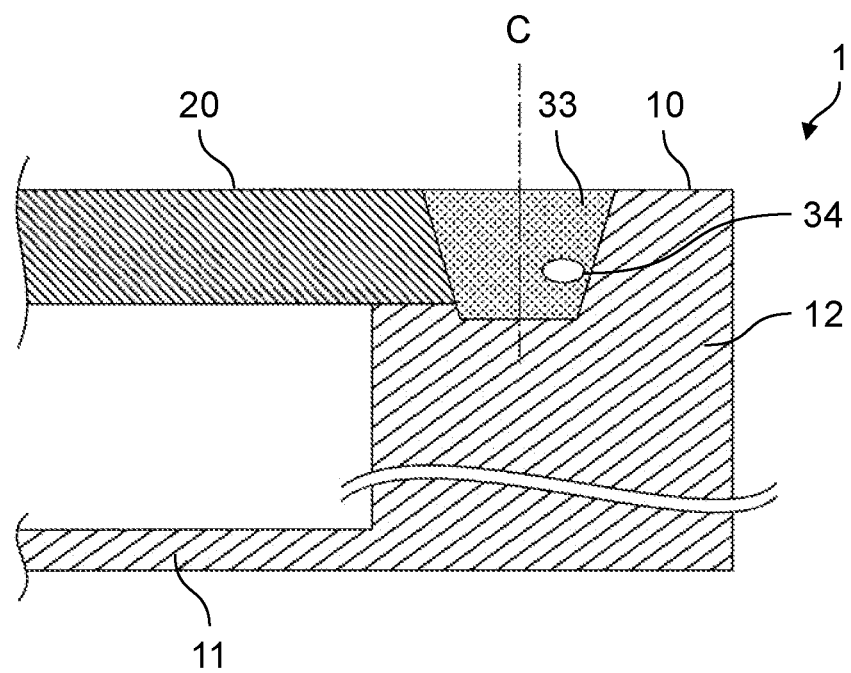
FIG. 5 is a sectional view showing a joined state of the cooling unit in accordance with a modified example.

For example, void 34 may be formed in any sites as long as it is formed in a unit main body 10 side from the center C from plasticized region 33. As shown in FIG. 5, void 34 may be formed inside plasticized region 33. Also in this case, the same advantageous effect can be obtained as in cooling unit 1 described in the exemplary embodiment.

For example, in the friction stir welding step, by increasing the rotational speed or the movement speed of rotary tool 40, void 34 can be positioned inside plasticized region 33. In other words, when the rotational speed or the moving speed of rotary tool 40 is increased, followability when sealing body 20 at the retreating side flows and fills the rear part of rotary tool 40 is deteriorated, and the moving speed of void 34 becomes slower than the moving speed of rotary tool 40. Therefore, void 34 does not move to unit main body 10 in the forward side and void 34 is formed inside plasticized region 33.

It should be construed that the exemplary embodiments disclosed herein are illustrative in all pointes, and are not restrictive. The scope of the present disclosure is represented by the scope of the claims and not by the above description, and it is intended that all modifications within the sense and scope equivalent to the claims are involved in the scope of the present invention.

The present disclosure can provide a cooling unit capable of securing joining strength between a unit main body and a sealing body and having good reliability, and a method for manufacturing the cooling unit.

INDUSTRIAL APPLICABILITY

Cooling unit 1 of the present disclosure is suitable for use in electronic equipment on which a high-performance power module to be used for inverter control of a vehicle-mounted battery charger, an air-conditioning equipment, or the like, is installed.

REFERENCE MARKS IN THE DRAWINGS 1 cooling unit
10 unit main body
11 bottom portion
12 peripheral wall portion
13 stepped portion
131 stepped bottom surface
132 stepped side surface
14 opening
20 sealing body
21 side surface
31 butted portion
32 gap
33 plasticized region 34 void
35 stress concentration portion

What is claimed is:

1. A cooling unit comprising:
a unit main body having a bottom portion and a peripheral wall portion rising from a peripheral edge of the bottom portion; and
a seal for sealing an opening of the unit main body, wherein:
the unit main body is joined to the seal through a plasticized region;
a void is defined in the peripheral wall portion of the unit main body; and
the void has a size of 0.3 mm or more and 1.0 mm or less in a direction parallel or perpendicular to the bottom portion of the unit main body.

2. The cooling unit according to claim 1, wherein:
the unit main body comprises a first aluminum alloy;
the seal comprises a second aluminum alloy; and
a rigidity of the first aluminum alloy is higher than a rigidity of the second aluminum alloy.

3. The cooling unit according to claim 2, wherein the unit main body comprises an aluminum alloy casting material, and the seal comprises an aluminum alloy expanded material.

4. The cooling unit according to claim 1, wherein a stress concentration portion is defined inside the plasticized region at a position at or adjacent to the seal and apart from a center of the plasticized region.

5. The cooling unit according to claim 4, wherein the void is not present at the stress concentration portion.

* * * * *